(12) United States Patent
Xue

(10) Patent No.: US 8,487,677 B1
(45) Date of Patent: Jul. 16, 2013

(54) PHASE LOCKED LOOP WITH ADAPTIVE BIASING

(75) Inventor: Dashun Xue, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/434,946

(22) Filed: Mar. 30, 2012

(51) Int. Cl.
*H03L 7/06* (2006.01)

(52) U.S. Cl.
USPC .......................................... 327/157; 327/148

(58) Field of Classification Search
USPC ................................... 327/148, 157
See application file for complete search history.

(56) References Cited

U.S. PATENT DOCUMENTS

| | | | |
|---|---|---|---|
| 5,339,050 A | 8/1994 | Llewellyn | |
| 5,594,392 A | 1/1997 | Kondoh et al. | |
| 6,614,287 B1 | 9/2003 | Gauthier et al. | |
| 6,693,496 B1 | 2/2004 | Lebouleux | |
| 6,963,232 B2 * | 11/2005 | Frans et al. | 327/156 |
| 7,135,900 B2 | 11/2006 | Sohn | |
| 7,248,086 B2 * | 7/2007 | Frans et al. | 327/147 |
| 7,812,650 B2 * | 10/2010 | Song et al. | 327/156 |
| 8,149,032 B2 | 4/2012 | Vlasenko et al. | |
| 2004/0108905 A1 | 6/2004 | Mason | |
| 2004/0169563 A1 | 9/2004 | Abbasi et al. | |
| 2005/0035797 A1 * | 2/2005 | Frans et al. | 327/156 |
| 2005/0068073 A1 | 3/2005 | Shi et al. | |
| 2006/0119404 A1 * | 6/2006 | Yeh | 327/157 |
| 2007/0159264 A1 | 7/2007 | Jung et al. | |
| 2007/0188203 A1 * | 8/2007 | Kimura et al. | 327/156 |
| 2008/0186066 A1 | 8/2008 | Jung et al. | |
| 2009/0160510 A1 * | 6/2009 | Song et al. | 327/157 |
| 2009/0160560 A1 * | 6/2009 | Song et al. | 331/17 |
| 2012/0051480 A1 * | 3/2012 | Usugi et al. | 375/376 |
| 2012/0119801 A1 * | 5/2012 | Hsieh et al. | 327/156 |
| 2012/0126866 A1 * | 5/2012 | Hsieh et al. | 327/157 |
| 2012/0153999 A1 * | 6/2012 | Kim | 327/157 |
| 2012/0223752 A1 * | 9/2012 | Huang et al. | 327/157 |
| 2012/0223753 A1 * | 9/2012 | Moore | 327/157 |
| 2012/0235718 A1 * | 9/2012 | Thakur et al. | 327/157 |

OTHER PUBLICATIONS

Maneatis, John G. "Low-Jitter Process-Independent DLL and PLL Based on Self-Biased Techniques." IEEE Journal of Solid-State Circuits, vol. 31, No. 11, Nov. 1996 pp. 1723-1732.

Sidiropoulos, Stefanos et al. "Adaptive Bandwidth DLLs and PLLs using Regulated Supply CMOS Buffers" 2000 Symposium on VLSI Circuits Digest of Technical Papers. 2000 IEEE pp. 124-127.

* cited by examiner

*Primary Examiner* — Adam Houston
(74) *Attorney, Agent, or Firm* — Gary Stanford

(57) ABSTRACT

A phase locked loop including first and second charge pumps, a voltage buffer and a bias generator for adaptive biasing for improved performance. A voltage controlled oscillator, feedback circuit and phase detector portions may be provided to operate similar to conventional configurations. The first charge pump receives an adjust signal, such as from the phase detector, and selectively charges an intermediate node. The second charge pump receives the adjust signal and selectively charges a control node developing the control voltage for the VCO. A loop filter capacitor is referenced to the intermediate node. The voltage buffer, replacing the loop filter resistor, buffers the intermediate node and drives the control node. The bias generator converts the control voltage to a converter bias current based on the control voltage and adjusts the charge pump currents and a bias current of the voltage buffer.

20 Claims, 3 Drawing Sheets

PHASE LOCKED LOOP WITH ADAPTIVE BIASING

BACKGROUND OF THE INVENTION

1. Field of the Invention

The present invention relates generally to phase locked loops, and more particularly to a phase locked loop with adaptive biasing for improved performance.

2. Description of the Related Art

A conventional phase locked loop (PLL) includes a phase frequency detector (PFD), a charge pump (CP), a loop filter, a voltage-controlled oscillator (VCO), and a frequency divider. The loop filter normally includes a resistor in series with a capacitor. The loop gain and damping ratio typically characterize PLL performance. For a conventional PLL, the charge pump current, the VCO gain and the loop filter resistance are fixed so that it has a fixed damping ratio and a fixed loop gain.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
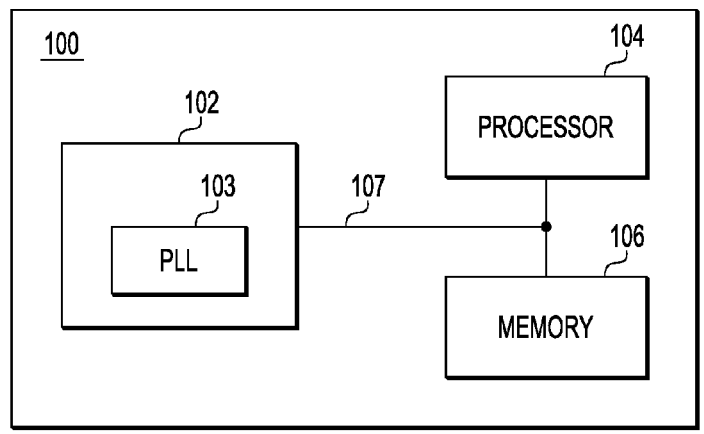
FIG. 1 is a simplified block diagram of an electronic system including a PLL implemented according to one embodiment.

The following description is presented to enable one of ordinary skill in the art to make and use the present invention as provided within the context of a particular application and its requirements. Various modifications to the preferred embodiment will, however, be apparent to one skilled in the art, and the general principles defined herein may be applied to other embodiments. Therefore, the present invention is not intended to be limited to the particular embodiments shown and described herein, but is to be accorded the widest scope consistent with the principles and novel features herein disclosed.

The loop gain of the phase locked loop (PLL) should be set as close as possible to its operating frequency in order to minimize jitter of the PLL. The loop gain, however, is affected by many factors, such as, for example, process technology factors, voltage and temperature variations, and noisy environments. A PLL should first be able to meet stability constraints under worst case conditions, so that the loop gain is normally set at the lowest operating frequency applicable for the worst case conditions, rather than being set for optimized performance. Conventional PLLs, therefore, have relatively narrow operating frequency range and poor jitter performance.

Existing solutions have proposed methods to make the damping ratio and the tracking bandwidth constant, where the tracking bandwidth is the ratio of loop bandwidth to PLL operating frequency. In one method, the loop filter resistor is implemented by an amplifier and set to be inversely proportional to the square root of charge pump current. Thus, the VCO frequency and the PLL loop bandwidth are also set to be proportional to the square root of charge pump current so that the ratio of loop bandwidth and PLL operating frequency is constant.

In the existing solutions, however, the bias current is proportional to the square of the loop control voltage, so that it consumes an appreciable amount of power particularly at higher frequencies. Moreover, the bias generator is provided within the PLL loop and provides current to the charge pump, the amplifier and the VCO. These existing solutions, therefore, cause the damping ratio and the tracking bandwidth to be dependent upon the VCO gain and effective output capacitance of each VCO stage. Since the effective capacitance is affected by parasitic capacitance, and since both the VCO gain and effective capacitance vary with many factors, such as process, voltage and temperature, it is difficult to control or otherwise predict these values accurately. Thus, the tracking bandwidth property is often deteriorated by these and other variations.

A PLL as described herein is configured with adaptive biasing to achieve a constant damping ratio and a constant tracking bandwidth. The PLL topology with adaptive biasing has a wider operating frequency range and improved jitter performance as compared to conventional configurations. Compared to other existing solutions, the PLL with adaptive biasing as described herein also exhibits lower power operation, broader operating frequency range and a tracking bandwidth which is process independent. In one embodiment, the PLL includes a bias generator (voltage to current converter), a second charge pump and a voltage buffer, where the voltage buffer effectively replaces the loop filter resistor. The bias generator senses the control voltage provided to the voltage controlled oscillator and provides bias values for the charge pumps and the voltage buffer. The disclosed PLL achieves tracking bandwidth in a manner which is not dependent on the gain or effective capacitance of the VCO so that tracking bandwidth is easier to predict and control, which in turn makes the PLL more accurate and robust. Since the bias generator does not provide current to the VCO, the VCO may be separately designed.

FIG. 1 is a simplified block diagram of an electronic system 100 including a PLL 103 implemented according to one embodiment. The electronic system 100 includes a timing block 102, a processor block 104, and a memory block 106 coupled together by a system interface 107. Although not shown, additional devices and systems and/or sub-systems may be included, such as a power system and an input/output (I/O) system and the like. The processor block 104 may include one or more processing devices or microprocessors or the like. The memory block 106 may be implemented according to any suitable memory type with one or more memory devices, such as random access memory (RAM) devices and/or read-only memory (ROM) devices or the like. The system interface 107 may be implemented in any suitable manner to enable communications between the timing block 102, the processor block 104 and the memory block 106, such as any type of bus structure, switch structure, switch fabric, network structure, etc. The timing block 102 incorporates the PLL 103 and may be used to generate one or more oscillating signals or clock signals or the like for use by other components or devices in the system.

The electronic system 100 may be implemented as a system-on-chip (SOC) or as an embedded processing system or the like. Alternatively, the electronic system 100 may be implemented in a discrete manner in which the timing block 102, the processor block 104 and the memory block 106 may each be implemented on a separate integrated circuit (IC) or otherwise include any combination of one or more ICs or semiconductor chips or the like. The timing block 102, for example, may be integrated on a separate IC incorporating the PLL 103. The electronic system 100 may be configured for any type of application, such as communication systems, computer systems, sensing devices, etc., and for any one or more of consumer, industrial, commercial, computing, and/or automotive fields.

Figure 2:
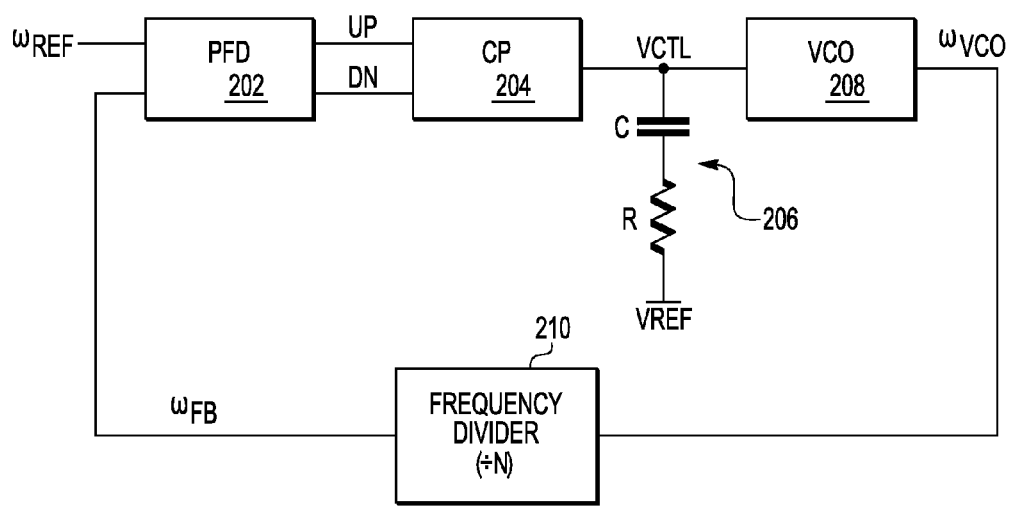
FIG. 2 is a simplified block and schematic diagram of a conventional PLL.

FIG. 2 is a simplified block and schematic diagram of a conventional PLL 200. The conventional PLL 200 includes a phase frequency detector (PFD) 202, a charge pump (CP) 204, a loop filter 206, a voltage controlled oscillator (VCO) 208, and a feedback circuit shown as a frequency divider 210. The PFD 202 receives a reference frequency signal $\omega_{REF}$ and a feedback frequency signal $\omega_{FB}$ and outputs an up (UP) signal and a down (DN) signal. The UP and DN signals are provided to respective inputs of a charge pump 204, which generated a control voltage VCTL filtered by the loop filter 206. In the illustrated embodiment, the loop filter 206 includes a capacitor C and a resistor R coupled in series between VCTL and a reference node VREF, which may be any positive, negative or ground voltage level. VCTL is also provided to an input of the VCO 204, having an output providing an output frequency signal $\omega_{VCO}$ at an output of the PLL 200. The output frequency signal $\omega_{VCO}$ has a frequency which is proportional to the voltage level of VCTL. The output frequency signal $\omega_{VCO}$ is fed back to an input of the frequency divider 210, in which the frequency divider 210 generates the feedback frequency signal $\omega_{FB}$ fed back to an input of the PFD 202. The frequency divider 210 divides the frequency of the output frequency signal $\omega_{VCO}$ by a suitable frequency divider ratio N (e.g., ÷N) to control the frequency of the feedback frequency signal $\omega_{FB}$. N may be an integer, but is not limited an integer value.

The PFD 202 compares the phase and frequency of signals $\omega_{REF}$ and $\omega_{FB}$ and outputs the UP and DN signals to adjust phase and frequency of $\omega_{FB}$ in an attempt to match that of $\omega_{REF}$.

The UP and DN signals are adjust signals in which a single adjust signal may be used in an alternative embodiment. The CP 204 generally operates to charge and discharge the capacitor C of the loop filter 206 based on the UP and DN signals to adjust VCTL accordingly. The VCO 208 correspondingly adjusts the output frequency $\omega_{VCO}$ based on VCTL, which is divided down by the voltage divider 210 to develop the feedback frequency signal $\omega_{FB}$. In this manner, the PLL 200 generally operates to generate $\omega_{VCO}$ such that $\omega_{VCO}=N\cdot\omega_{REF}$.

The conventional PLL 200 has several deficiencies, including relatively narrow operating frequency range and poor jitter performance. If the PLL 200 is used as the PLL 103 of the electronic system 100, then the overall performance of the electronic system 100 may be compromised. Jitter is an undesired deviation of the desired frequency of $\omega_{VCO}$ which leads to a distorted output. The jitter is typically random an unpredictable which affects the overall accuracy of the signals using or otherwise based on the output frequency signal $\omega_{VCO}$. As an example, if the output of the PLL 200 is used as or otherwise used to generate a sampling clock signal for an analog to digital converter (ADC) (not shown), then the overall accuracy and performance of the ADC is compromised by the undesired jitter.

Figure 3:
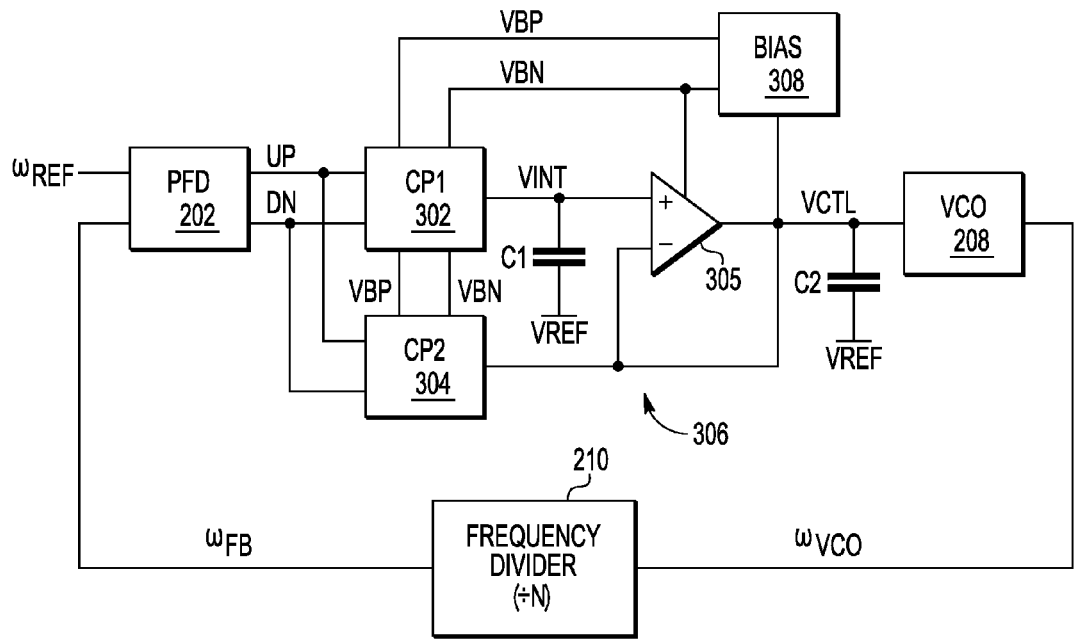
FIG. 3 is a simplified block and schematic diagram of a PLL implemented according to one embodiment.

FIG. 3 is a simplified block and schematic diagram of a PLL 300 implemented according to one embodiment. Similar components as those used in the conventional PLL 200 assume similar reference numerals. As shown, the PLL 300 includes the PFD 202, the VCO 208 and the frequency divider 210, which are coupled to operate in substantially the same manner as described for the PLL 200. The CP 204 and the loop filter 206, however, are replaced by a pair of charge pumps 302 and 304 (CP1 and CP2), a loop filter 306, and a bias generator 308. The loop filter 306 is implemented by a capacitor C1 and a voltage buffer 305, in which the voltage buffer 305 generally replaces the loop filter resistor R. A capacitor C2 is provided to reduce ripple voltage on VCTL.

The PFD 202 of the PLL 300 operates in substantially the same manner by comparing the phase and frequency of signals $\omega_{REF}$ and $\omega_{FB}$ and generating the UP and DN signals to adjust phase and frequency of $\omega_{FB}$ in an attempt to match that of $\omega_{REF}$. The UP and DN signals are both provided to respective inputs of each of the charge pumps 302 and 304. The output of the charge pump CP1 develops an intermediate voltage VINT which is provided to one end of the capacitor C1 and to the non-inverting or positive (+) input of the voltage buffer 305. The other end of the capacitor C1 is coupled to VREF. The inverting or negative (−) input of the voltage buffer 305 is coupled to its output which develops the control voltage VCTL. The output of the charge pump CP2 is coupled to VCTL and thus to the negative input and output of the voltage buffer 305. VCTL is provided to the input of the bias generator 308 and to the input of the VCO 208. The VCO 208 operates in substantially the same manner and correspondingly adjusts the output frequency signal $\omega_{VCO}$ based on VCTL, which is divided down by the voltage divider 210 to develop the feedback frequency signal $\omega_{FB}$. In this manner, the PLL 300 also generally operates to generate $\omega_{VCO}$ such that $\omega_{VCO}=N\cdot\omega_{REF}$.

The charge pumps 302 and 304 and the voltage buffer 305 of the PLL 300 each have at least one current control and/or bias input coupled to a corresponding bias output provided by the bias generator 308. As shown, the bias generator 308 provides a P-type bias voltage VBP and an N-type bias voltage VBN. VBP and VBN are both provided to corresponding bias inputs of each of the charge pumps 302 and 304. At least one of the bias voltages, such as VBN, is provided to a bias input of the voltage buffer 305.

Figure 4:
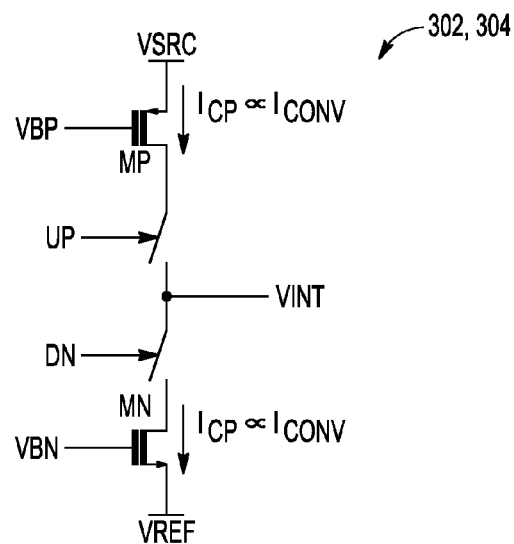
FIG. 4 is a schematic diagram of one embodiment of each of the charge pumps CP1 and CP2 of FIG. 3.

FIG. 4 is a schematic diagram of one embodiment of each of the charge pumps CP1 302 and CP2 304, which are each configured in substantially the same manner. Each of the charge pumps 302 and 304 includes a P-type device MP, an N-type device MN, and a pair of switches S1 and S1 coupled in series between source voltages VSRC and VREF (e.g., VSRC of VDD or VCC relative to VREF at ground or VSS or other suitable reference voltage level). The devices MP and MN may each be implemented as a metal-oxide semiconductor (MOS) transistor, such as using PMOS and NMOS transistors. The switches S1 and S2 are each figuratively shown as single-pole, single throw (SPST) switches each having switched terminals and a control terminal receiving either the UP signal or the DN signal. The switches S1 and S2 may be implemented using MOS transistors or the like. As shown, the source of MP is coupled to VSRC and its drain is coupled to one switched terminal of S1. The other switched terminal of S1 is coupled to one switched terminal of S2 at the node developing VINT. The other switched terminal of S2 is coupled to the drain of MN, having its source coupled to VREF. The gate of MP receives the bias voltage VBP and the gate of MN receives the bias voltage VBN. Switch S1 is controlled by the UP signal and switch S2 is controlled by the DN signal.

MP and MN are shown developing a current $I_{CP}$, which represents the charge/discharge current for both charge pumps CP1 302 and CP2 304. In operation, when UP is asserted high and DN is asserted low, switch S1 is closed while S2 is opened so that current $I_{CP}$ flows to its output (e.g., CP1 charges the capacitor C1). When DN is asserted high and UP is asserted low, switch S2 is closed while S1 is opened so that current $I_{CP}$ is drawn from its output (e.g., CP1 discharges the capacitor C1).

Figure 5:
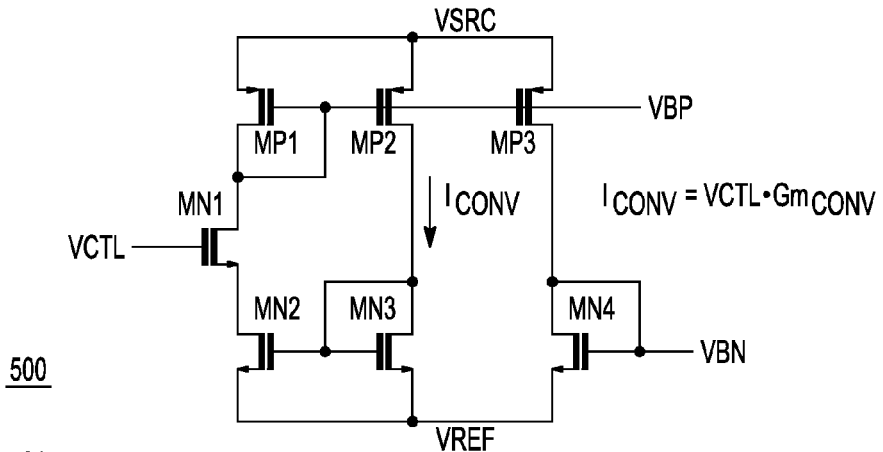
FIG. 5 is a schematic diagram of a bias generator according to one embodiment which may be used as the bias generator of FIG. 3.

FIG. 5 is a schematic diagram of a bias generator 500 according to one embodiment which may be used as the bias generator 308. The bias generator 500 includes 3 PMOS transistors MP1, MP2 and MP3 and 4 NMOS transistors MN1, MN2, MN3 and MN4. The sources of MP1-MP3 are coupled to the source voltage VSRC and their gates are coupled together at a common node developing the bias voltage VBP. MP1 (diode-coupled) has its gate coupled to its drain which is further coupled to the drain of MN1. VCTL is provided to the gate of MN1, and the source of MN1 is coupled to the drain of MN2. The drain of MP2 is coupled to the drain and gate of MN3 (diode-coupled) and also to the gate of MN2, and the drain of MP3 is coupled to the drain and gate of MN4 (diode-coupled) at a node which develops the bias voltage VBN. The sources of MN2-MN4 are coupled to VREF.

Figure 6:
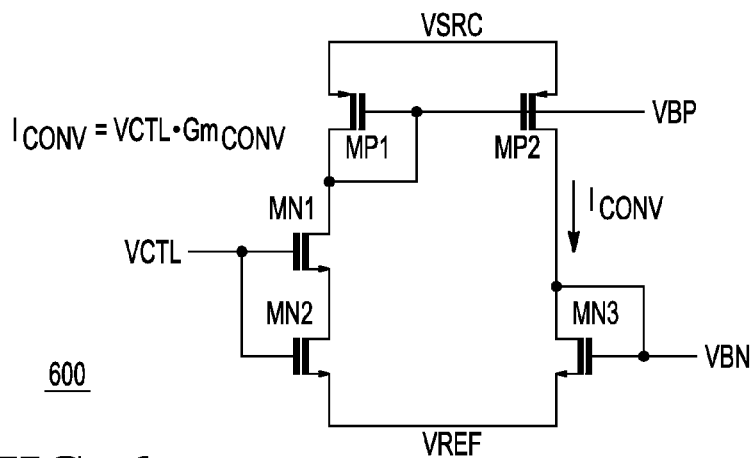
FIG. 6 is a schematic diagram of a bias generator according to another embodiment which may also be used as the bias generator of FIG. 3.

FIG. 6 is a schematic diagram of a bias generator 600 according to another, slightly simpler embodiment which may also be used as the bias generator 308. The bias generator 600 includes 2 PMOS transistors MP1 and MP2 and 3 NMOS transistors MN1, MN2 and MN3. The sources of MP1 and MP2 are coupled to VSRC and their gates are coupled together at a common node developing the bias voltage VBP. MP1 (diode-coupled) has its gate coupled to its drain which is further coupled to the drain of MN1. VCTL is provided to the gates of MN1 and MN2, and the source of MN1 is coupled to the drain of MN2. The drain of MP2 is coupled to the drain and gate of MN3 (diode-coupled) at a node developing the bias voltage VBN. The sources of MN2 and MN3 are coupled to VREF.

For both bias generators 500 and 600, MN2 is configured to operate in its triode (or ohmic) region so that it functions as a resistance. The resistance value of MN2 is controlled by a converter bias current $I_{CONV}$ shown as the drain current of MP2 flowing to the drain/gate of MN3, where $I_{CONV}$ is controlled by the control voltage VCTL. The gate voltage of MP1 and MP2 (and MP3 for bias generator 500) develops the bias voltage VBP based on VCTL, and the drain/gate voltage of MN4 (for bias generator 500) or of MN3 (for bias generator 600) develops the bias voltage VBN. The bias voltages VBP and VBN are provided to the charge pumps CP1 302 and CP2 304 and at least one of the bias voltages (e.g., VBN) is provided to control the bias current of the voltage buffer 305.

Figure 7:
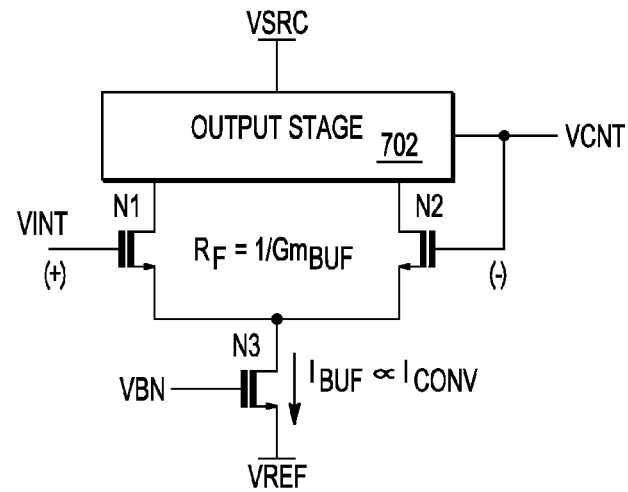
FIG. 7 is a simplified schematic and block diagram of a voltage buffer which may be used as the voltage buffer of FIG. 3 according to one embodiment.

FIG. 7 is a simplified schematic and block diagram of a voltage buffer 700 which may be used as the voltage buffer 305 according to one embodiment. The voltage buffer 700 is a simplified version in which it is understood that alternative (and more sophisticated) embodiments are contemplated. The voltage buffer 700 includes an output stage 702 and an input stage including NMOS transistors N1, N2 and N3. The output stage 702 is coupled to VSRC and has an output coupled to the node developing the control voltage VCTL, where the output stage 702 may be implemented in any suitable manner. The output stage 702 is further coupled to the drains of N1 and N2, which collectively form a differential input of the voltage buffer 700. The sources of N1 and N2 are coupled together and to the drain of N2, having its source coupled to VREF. N1 and N2 form an input differential pair in which VINT is provided to the gate of N1 and VCTL is provided to the gate of N2. The gate of N3 receives VBN and develops a bias current $I_{BUF}$ for the voltage buffer 700.

The charge pump current $I_{CP}$ and the bias current $I_{BUF}$ of the voltage buffer 305 are each proportional to the converter bias current $I_{CONV}$ (e.g., $I_{CP} \propto I_{CONV}$ and $I_{BUF} \propto I_{CONV}$, in which the symbol "$\propto$" denotes a proportional relationship). The relative proportionality may be achieved by the relative size of the MOS devices implementing the respective functional blocks. $I_{CONV}$ is determined by VCTL and transconductance (voltage-current conversion) gain $GM_{CONV}$ of the bias generator 308 (such as implemented using 500 or 600 or similar configuration) according to the following equation 1:

$$I_{CONV} = VCTL \cdot Gm_{CONV} \quad (1)$$

Using linear approximation, the loop gain $K_{PLL}$ of the PLL 300 is according to the following equation 2:

$$K_{PLL} = \frac{I_{CP} \cdot R_F \cdot K_{VCO}}{2\pi \cdot N} \quad (2)$$

where "$R_F$" is the loop filter resistance, $K_{VCO}$ is the gain of the VCO 208, and "N" is the frequency divider ratio. The voltage buffer 305 effectively replaces the loop resistor R (with resistance R) with $R_F$, in which the voltage buffer 305 has a buffer transconductance referred to as $Gm_{BUF}$, and in which $R_F$ is inversely proportional to $Gm_{BUF}$. The bias voltage provided by the bias generator 308 generates the bias current $I_{BUF}$ of the voltage buffer 305, where $I_{BUF}$ is related to $R_F$ and $Gm_{BUF}$ according to the following equation 3:

$$R_F \propto \frac{1}{Gm_{BUF}} \propto \sqrt{\frac{1}{I_{BUF}}} \quad (3)$$

The frequency of the operating frequency signal $\omega_{REF}$ of the PLL 300 may be determined according to the following equation 4:

$$\omega_{REF} = \frac{\omega_{VCO}}{N} = \frac{VCTL \cdot K_{VCO}}{N} \quad (4)$$

Thus, the ratio of the loop gain $K_{PLL}$ and frequency of the operating frequency signal $\omega_{REF}$ (tracking bandwidth) may be determined according to the following equation 5:

$$\frac{K_{PLL}}{\omega_{REF}} = \frac{\frac{I_{CP}}{2\pi} R_F \cdot K_{VCO} \cdot \frac{1}{N}}{\frac{VCTL \cdot K_{VCO}}{N}} = $$

$$\frac{R_F}{2\pi} \cdot \frac{I_{CP}}{VCTL} \propto R_F \frac{I_{CONV}}{VCTL} \propto R_F \cdot Gm_{CONV} \propto \sqrt{\frac{I_{CONV}}{I_{BUF}}} \rightarrow$$

CONSTANT in which "CONSTANT" means that the ratio of the loop gain to operating frequency is constant. In this manner, tracking bandwidth is achieved by the PLL 300.

In one embodiment, the charge pumps CP1 302 and CP2 304, the voltage buffer 305, the bias generator 308 and the VCO 208 are implemented using MOS devices. A value "k" is defined as a MOS device transconductance and $V_{TH}$ is defined as the threshold voltage of the MOS device. The bias current $I_{VCO}$ for the VCO 208 is determined according to the following equation 6:

$$I_{VCO} = \frac{1}{2} \cdot k \cdot (VCTL - V_{TH})^2 \tag{6}$$

The output frequency signal $\omega_{VCO}$ of the VCO 208 may be stated according to the following equation 7:

$$\omega_{VCO} = \frac{\sqrt{2 \cdot k \cdot I_{VCO}}}{C_B} \tag{7}$$

where $C_B$ is the total output capacitance of the VCO 208. Using these relationships, the VCO gain $K_{VCO}$ of the VCO 208 may be derived as shown by the following equation 8:

$$K_{VCO} = \frac{k}{C_B} \tag{8}$$

Thus, the damping ratio $\zeta$ for the PLL 300 may be determined according to the following equation 9:

$$\zeta = \frac{1}{2} \cdot R_F \cdot \sqrt{\frac{I_{CP} \cdot K_{VCO} \cdot C1}{2\pi \cdot N}} \propto \frac{\sqrt{I_{CP}}}{\sqrt{I_{BUF}}} \rightarrow \text{CONSTANT} \tag{9}$$

where C1 is the capacitance of the loop capacitor C1 of PLL 300, and "CONSTANT" again means that the damping ratio is a relatively constant value. Since the damping ratio $\zeta$ is a constant value, the PLL 300 exhibits a stable and relatively fast response.

Since tracking bandwidth is achieved by the PLL 300 and the damping ratio is constant, the PLL 300 exhibits relatively low power, low jitter, and a broad operating frequency range. The tracking bandwidth is independent of the MOS process used to fabricate the PLL.

In summary, a bias generator is provided outside the PLL loop which receives the control voltage (VCTL) and which develops a converter current $I_{CONV}$=VCTL·$Gm_{CONV}$, in which the voltage to current gain $Gm_{CONV}$ is proportional to the square root of the bias current $I_{CONV}$. The ratio of PLL loop gain and operating frequency is proportional to R·$Gm_{CONV}$. R is replaced with a voltage buffer having a gain $Gm_{BUF}$, in which the filter resistance $R_F$=1/$Gm_{BUF}$. $I_{CONV}$ is used to develop $I_{BUF}$ in the voltage buffer ($I_{CONV} \propto I_{BUF}$), in which $Gm_{BUF}$ is proportional to the square root of $I_{BUF}$. Thus, $R_F$ is inversely proportional to the bias current $I_{BUF}$ in the voltage buffer. Since $GM_{CONV}$ is proportional to the square root of bias current $I_{CONV}$, since $R_F$ is inversely proportional to $I_{BUF}$, and since $I_{BUF}$ is proportional to $I_{CONV}$, then it follows that the ratio of PLL loop gain and operating frequency is constant and tracking bandwidth is obtained. Furthermore, the damping ratio of the PLL is constant.

Although the invention is described herein with reference to specific embodiments, various modifications and changes can be made without departing from the scope of the present invention as set forth in the claims below. For example, circuit implementations using NMOS transistors may be implemented using PMOS transistors and vice-versa, in which "N" and "P" generally denote different conductivity types. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims. Unless stated otherwise, terms such as "first" and "second" are used to arbitrarily distinguish between the elements such terms describe. Thus, these terms are not necessarily intended to indicate temporal or other prioritization of such elements.

The invention claimed is:

1. A phase locked loop, comprising:
a voltage controlled oscillator generating an output frequency signal based on a control voltage, a feedback circuit which converts said output frequency signal to a feedback frequency signal, and a phase detector which generates at least one adjust signal based on comparing frequencies of said feedback frequency signal and a reference frequency signal;
a first charge pump receiving said at least one adjust signal, having at least one current control input, and having an output coupled to an intermediate node;
a second charge pump receiving said at least one adjust signal, having at least one current control input, and having an output coupled to a control node developing said control voltage;
a capacitor coupled between said intermediate node and a reference node;
a voltage buffer having a first input coupled to said intermediate node, having at least one bias input, and having a second input and an output coupled together and to said control node; and
a bias generator which converts said control voltage to a converter bias current based on said control voltage, and which has at least one bias output which is based on said converter bias current and which is provided to said current control inputs of said first and second charge pumps and to said at least one bias input of said voltage buffer.

2. The phase locked loop of claim 1, wherein said bias generator converts said control voltage to said converter bias current based on a multiple of said control voltage and a bias transconductance gain.

3. The phase locked loop of claim 1, wherein said voltage buffer develops a buffer bias current which is proportional to said converter bias current.

4. The phase locked loop of claim 3, wherein said voltage buffer has a buffer transconductance gain which is inversely proportional to a predetermined loop filter resistance, and wherein said predetermined loop filter resistance is inversely proportional to a square root of said buffer bias current.

5. The phase locked loop of claim 1, wherein said first and second charge pumps each develop a corresponding charge pump current which is proportional to said converter bias current.

6. The phase locked loop of claim 1, wherein a ratio of loop gain and said reference frequency is constant.

7. The phase locked loop of claim 1, wherein a gain of said voltage controlled oscillator is constant and wherein a damping ratio of said phase locked loop is constant.

8. The phase locked loop of claim 1, wherein said first and second charge pumps, said voltage buffer and said bias generator comprise MOS devices stacked in series between source voltages.

9. The phase locked loop of claim 1, wherein said bias generator comprises:
a first transistor having a source coupled to a source voltage and having a drain and gate coupled together at a first bias node;
a second transistor having a source coupled to said source voltage, having a gate coupled to said first bias node, and having a drain;
a third transistor having a drain coupled to said drain of said first transistor, having a gate coupled to said control node, and having a source;
a fourth transistor having a drain coupled to said source of said first third transistor, having a source coupled to said reference node, and having a gate coupled to said control node; and
a fifth transistor having a drain and gate coupled together to said drain of said second transistor at a second bias node, and having a source coupled to said reference node.

10. The phase locked loop of claim 9, wherein said first and second transistors are of a first conductivity type, and wherein said third, fourth and fifth transistors are of a second conductivity type.

11. The phase locked loop of claim 1, wherein said bias generator comprises:
a first transistor having a source coupled to a source voltage and having a drain and gate coupled together at a first bias node;
a second transistor having a source coupled to said source voltage, having a gate coupled to said first bias node, and having a drain;
a third transistor having a source coupled to said source voltage, a gate coupled to said first bias node, and having a drain;
a fourth transistor having a drain coupled to said drain of said first transistor, having a gate coupled to said control node, and having a source;
a fifth transistor having a drain coupled to said source of said fourth transistor, having a source coupled to said reference node, and having a gate coupled to said drain of said second transistor;
a sixth transistor having a drain and gate coupled to said drain of said second transistor, and having a source coupled to said reference node; and
a seventh transistor having a drain and gate coupled together to said drain of said third transistor and to a second bias node, and having a source coupled to said reference node.

12. The phase locked loop of claim 11, wherein said first, second and third transistors are of a first conductivity type, and wherein said fourth, fifth, sixth and seventh transistors are of a second conductivity type.

13. The phase locked loop of claim of 1, wherein:
said bias generator comprises transistors forming a P-type bias node and an N-type bias node; and
wherein each of said first and second charge pumps comprises a first transistor of a first conductivity type and a second transistor of a second conductivity type having current terminals coupled in series between a source voltage and said reference node, wherein said first transistor has a gate coupled to said P-type bias node and wherein said second transistor has a gate coupled to said N-type bias node.

14. The phase locked loop of claim 13, wherein said first transistor comprises a PMOS transistor and wherein said second transistor comprises an NMOS transistor.

15. The phase locked loop of claim 1, wherein:
said bias generator comprises a first transistor forming an N-type bias node; and
wherein said voltage buffer comprises a second transistor coupled between a differential stage and said reference node, and wherein said second transistor has a gate coupled to said N-type bias node.

16. The phase locked loop of claim 1, wherein said phase locked loop is provided within a timing block coupled to a processor and a memory.

17. A method adaptively biasing a phase lock loop which includes a voltage controlled oscillator generating an output frequency signal based on a control voltage on a control node, a feedback circuit which converts the output frequency signal to a feedback frequency signal, and a phase detector which generates at least one adjust signal based on comparing frequencies of the feedback frequency signal and a reference frequency signal, said method comprising:
selectively charging and discharging a loop capacitor with a first charge current based on the at least one adjust signal to develop an intermediate voltage;
selectively charging and discharging the control node based on the at least one adjust signal with a second charge current;
providing a voltage buffer having a first input receiving the intermediate voltage and a second input and an output coupled to the control node;
converting the control voltage to a converter bias current based on the control voltage; and
generating at least one bias control signal based on the converter bias current for controlling the first and second charge currents and for biasing the voltage buffer.

18. The method of claim 17, wherein said generating comprises generating the at least one bias control signal so that the first and second charge currents and a buffer bias current of the voltage buffer are proportional to the converter bias current.

19. The method of claim 18, wherein said providing a voltage buffer comprises providing the voltage buffer with a transconductance gain which is inversely proportional to a predetermined loop filter resistance which is inversely proportional to a square root of the buffer bias current of the voltage buffer.

20. The method of claim 17, wherein said converting the control voltage comprises converting the control voltage to the converter bias current based on a multiple of the control voltage and a bias transconductance gain.

* * * * *